United States Patent
Schmidt

(10) Patent No.: US 6,954,986 B2
(45) Date of Patent: Oct. 18, 2005

(54) METHOD FOR FABRICATING ELECTRICAL CONNECTING ELEMENT

(75) Inventor: Walter Schmidt, Russikon (CH)

(73) Assignee: Dyconex AG, Bassersdorf (CH)

( * ) Notice: Subject to any disclaimer, the term of this patent is extended or adjusted under 35 U.S.C. 154(b) by 95 days.

(21) Appl. No.: 10/239,811
(22) PCT Filed: Mar. 30, 2001
(86) PCT No.: PCT/CH01/00204
§ 371 (c)(1), (2), (4) Date: Nov. 13, 2002
(87) PCT Pub. No.: WO01/80612
PCT Pub. Date: Oct. 25, 2001

(65) Prior Publication Data
US 2003/0121700 A1 Jul. 3, 2003

Related U.S. Application Data
(60) Provisional application No. 60/193,370, filed on Mar. 31, 2000.

(51) Int. Cl.$^7$ ................................................ H01K 3/10
(52) U.S. Cl. ........................... 29/852; 29/830; 29/846; 29/853
(58) Field of Search ..................... 29/853, 830, 829, 29/846, 852, 854, 861, 825; 174/250, 262; 83/685, 687; 361/397, 803; 257/E23.067

(56) References Cited

U.S. PATENT DOCUMENTS 3,346,950 A * 10/1967 Schick ........................ 29/853
3,668,762 A * 6/1972 Clark ........................... 29/238
4,663,840 A * 5/1987 Ubbens et al. ................. 29/853
6,601,297 B1 * 8/2003 Schmidt ....................... 29/852

FOREIGN PATENT DOCUMENTS

DE 195 22 338 A1 1/1997
EP 0 435 584 A1 7/1991

OTHER PUBLICATIONS

WO 99/49708, Method for Making Electrical Connections Between Conductors Separated by a Dielectric, Publication Date: Sep. 30, 1999.
WO 00/13062, Method for Producing Micro–Openings, Publication Date: Mar. 9, 2000.

* cited by examiner

Primary Examiner—Minh Trinh
(74) Attorney, Agent, or Firm—Rankin, Hill, Porter & Clark LLP

(57) ABSTRACT

A method for manufacturing electrical connecting elements or semifinished products. Microvias are formed in a dielectric substrate layer by piercing a substrate layer (1) through a first conducting layer (3), which essentially covers an entire side of the substrate. The perforation depth (d) is at least equal to the total thickness of the substrate and the first conducting layer. The conductor material of the first conducting layer (3), during the piercing step, is deformed so that it partially covers the wall of the hole fabricated by the piercing process. Plating the first conducting layer with additional conductor material bridges the little remaining distance between the conductor material and the opposite side of the substrate layer.

6 Claims, 2 Drawing Sheets

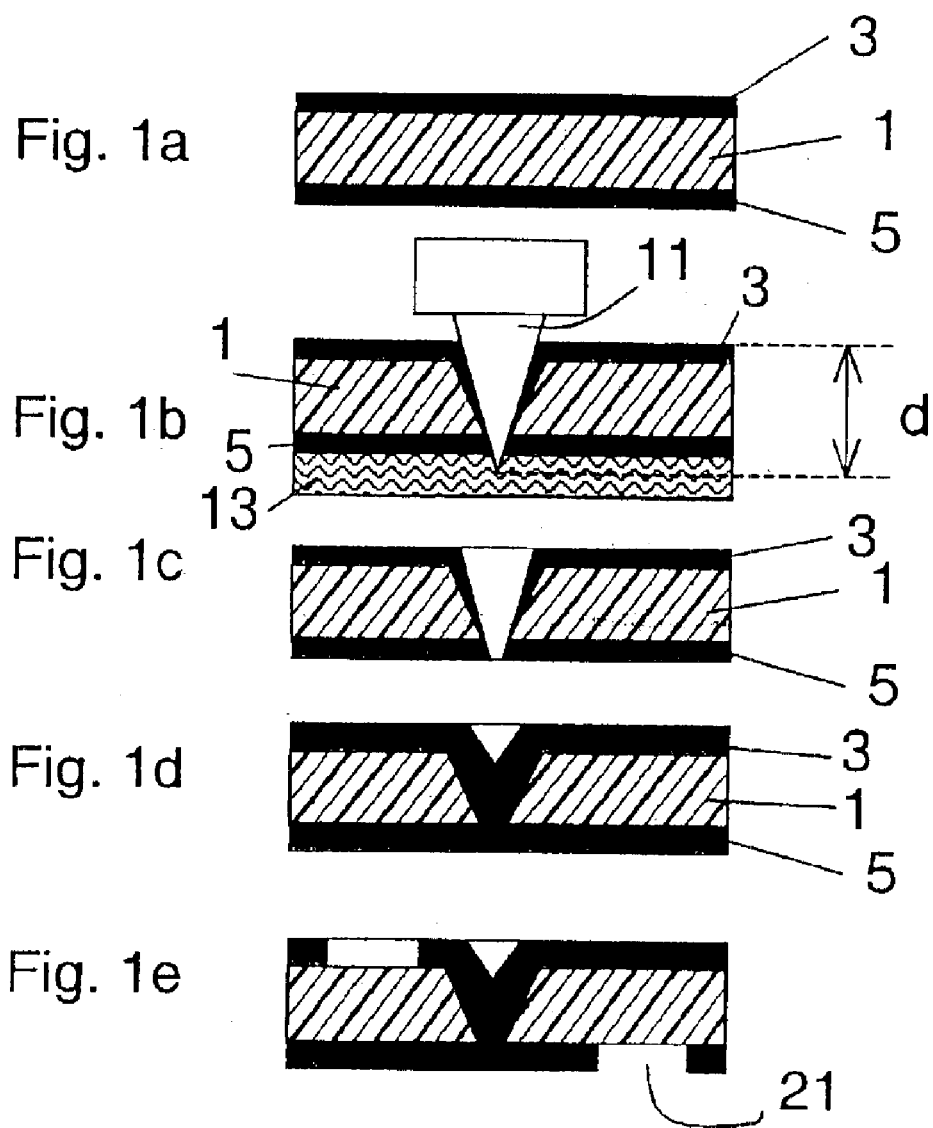

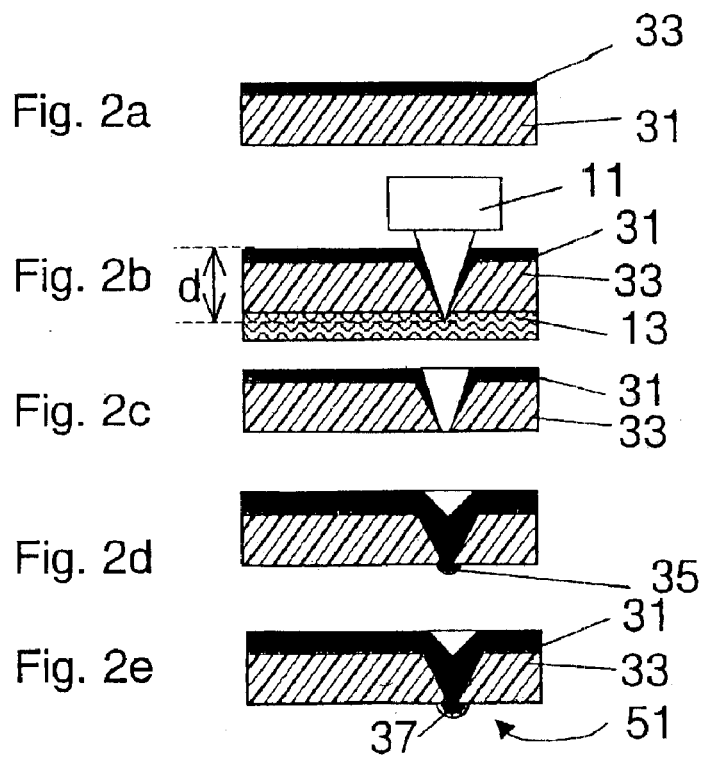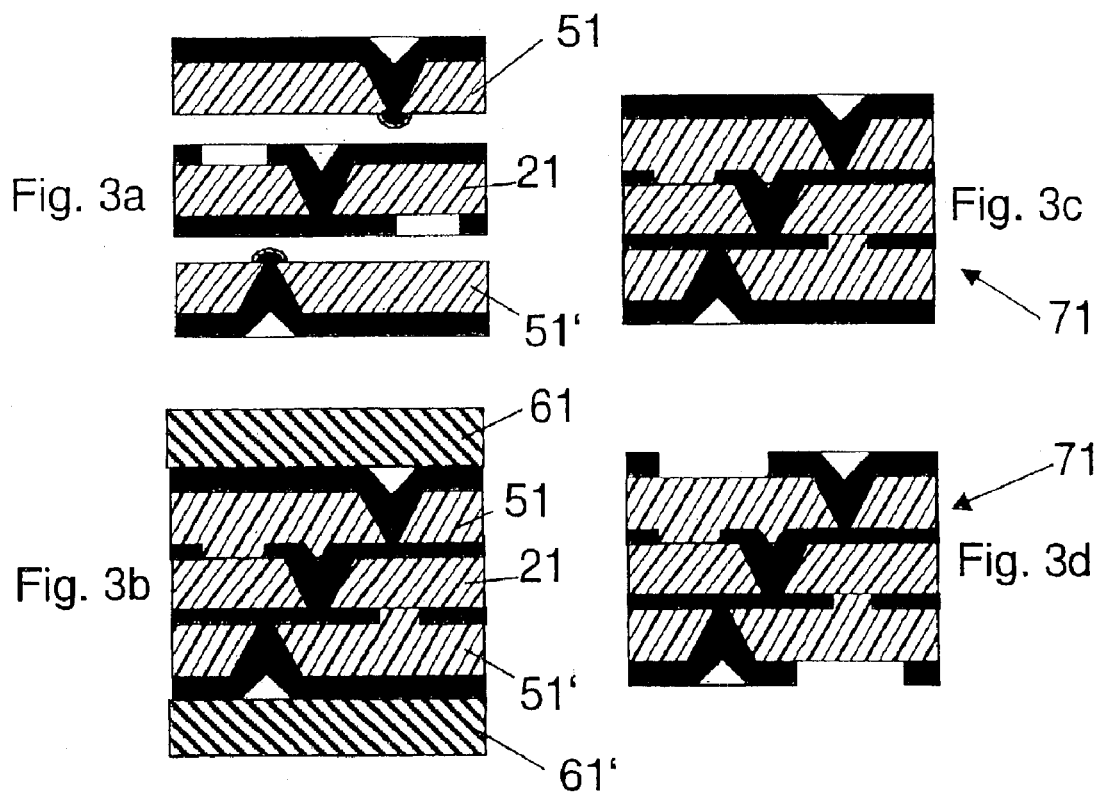

METHOD FOR FABRICATING ELECTRICAL CONNECTING ELEMENT

BACKGROUND OF THE INVENTION

1. Field of the Invention

The present invention relates to methods for fabricating electrical connecting elements such as Printed Circuit Boards (PCBs), High-Density-Interconnects (HDIs), Ball-Grid-Array (BGA) substrates, Chip Scale Packages (CSP), Multi-Chip-Module-(MCM) substrates, etc. The present invention also relates to an electrical connecting element and to an apparatus for fabricating electrical connecting elements.

2. Description of Related Art

In modern circuit board technology, due to increasing miniaturization, conventionally drilled through holes are increasingly being replaced by microvias. Methods for fabricating such microvias include laser drilling and plasma drilling as well as photochemical structuring. A new method for fabricating microvias has been disclosed in WO 00/13062. This new technology approach, the Micro-Perforation, is a method including mechanical embossing of micro-holes into deformable dielectric material. With Micro-Perforation, any shape of a microvia is feasible. By controlling the length and size of perforation-tips also the formation of very small blind microvias can be achieved.

However, the fabrication of blind microvias by Micro-Perforation and the other state of the art methods have in common that a via fabricating step has to be followed by a contacting step between the conducting layers or pads across the via. Depending on the microvia geometry, such a contacting step may be a chemical or physical deposition of some conductor material as a seed layer followed by an electroplating step. Plating of very small blind holes of 100 µm diameter and less is very tricky and often results in non-plated holes and consequently scrapped boards. Also, incomplete plating of sidewalls of the holes affects the reliability of the boards.

If, according to the state of the art, a build-up of three, four or more layers is produced, in a first step a core consisting of two conducting and structured layers separated by a dielectric substrate layer with vias is provided. Then, dielectric layers, which are coated on one side by a metal layer, are subsequently laminated on the core, perforated, plated, and structured. This procedure even enhances the impact of the above-mentioned shortcomings of the present lamination method. Testing of the via reliability and the quality of the structuring of the outermost layer is only possible after the latter has been laminated to the core and structured. If a via side wall is incompletely plated, the entire board has to be scrapped, including a possibly perfect core.

It therefore would be desirable to have a method that makes this plating step more reliable and leads to a reduction of production cost and of environmental impact caused by wet chemical bathes. Preferably, the method should also make more efficient testing possible and prevent the situation that an entire board including perfect parts has to be scrapped.

SUMMARY OF THE INVENTION

It is therefore an object of the invention to provide a method for the fabrication of microvias that overcomes drawbacks of existing methods and that especially makes the electroplating step for making an electrical contact between two conducting layers more reliable and efficient.

According to the invention, microvias are formed in a dielectric substrate layer by piercing the substrate layer through a first conducting layer, which essentially covers an entire side of the substrate. The perforation depth is at least equal to the total thickness of the substrate and the first conducting layer. The conductor material of the first conducting layer during the piercing step is deformed so that it partially covers the wall of the hole fabricated by the piercing process. The little remaining distance between the conductor material and the opposite side of the substrate layer can be easily bridged by plating the side of the first conducting layer with additional conductor material. If, at the pierced spot, the substrate layer comprises a conductor covering, a reliable via contact is formed. If, however, the substrate layer at the pierced spot is free of conductor material, protrusions at the pierced spots may result. These protrusions may be soldered or welded to conducting material of another substrate with structured conductor layers in order to manufacture a several-layer-build-up.

After the piercing step, a plasma or wet chemical cleaning step may follow to remove possible residues.

As already mentioned, after the piercing step, the distance between the deformed conductor material, e.g. copper, from the first conductor layer to the second side of the substrate can be easily bridged by the plated conductor material. There is no need of having a pre-covering of the surface by a chemical deposited copper. This eliminates all the critical plating processes which have usually to be performed in order to prepare the surface of the dielectric material to cover it by a chemically deposited metal layer as a seed layer for the plating.

The invention also relates to a product produced by the above method, namely to an electrical connecting element or to a semi-finished product.

BRIEF DESCRIPTION OF THE DRAWINGS

These and further features of the invention will be apparent with reference to the following description and drawings, wherein:

FIGS. 1a through 1e schematically show a PCB/HDI substrate (or a component of such a PCB/HDI substrate, respectively) during different stages of the production;

FIGS. 2a through 2e schematically represent a top cap or a bottom cap of a four layer build up PCB/HDI during different stages of the production; and, FIGS. 3a through 3d schematically show the production of a component of a four layer build-up using components produced according to FIGS. 1a through 1e and 2a through 2e.

DETAILED DESCRIPTION OF THE PREFERRED EMBODIMENTS

FIGS. 1a through 1e show a process to manufacture PCB/HDI substrates or semi-finished products for the production thereof by means of a micro-perforation technique. In the following, with reference to FIGS. 1a–1e, 2a–2e and 3a–3d a process for manufacturing a four-layer build-up is described. It should be noted, however, that the described process can also be used to produce an electrical connecting element of 2 layers, 3 layers, 5 layers, 6 layers or any other number of layers. A PCB/HDI substrate of two layers, for example, can be produced using the procedure of FIGS. 1a–1e. Also, a product produced according to FIGS. 2a–2e may by itself serve as a two layer PCB/HDI substrate. In order to produce a PCB/HDI substrate of more layers, to such a substrate produced in accordance with FIGS. 1a–1e (as a semi-finished product), the appropriate number of semi-finished products produced according to FIGS. 2a–2e has to be added.

In FIG. 1a, the core base material 1, which is already coated by a first conducting layer 3 on its first side (or top side) and a second conducting layer 5 on its second side (or bottom side), is shown. The base material (or substrate material) 1 is a dielectric, e.g. epoxy, polyimide, a liquid crystal polymer (LCP), polysulfone, polyester (PEEK), Polycarbonate etc. The conducting material may be copper or a copper alloy. It may also be another conducting material such as silver or a silver alloy. In the following description of an example, it is assumed that the conducting layers are clad copper layers. As an example, the thickness of the base material by be around 25–100 µm, the thickness of each clad copper layer around 5–35 µm. It however goes without saying that the invention also works for other material thicknesses.

In this clad material, by a first Micro-Perforation (MP) step microvias are formed: In FIG. 1b, a perforation tip 11 being applied from the first side of the substrate layer 1 is shown schematically. The perforation tip pierces the first conducting layer 3, the substrate material 1 as well as, at least partially, the second conducting layer 5. The perforation depth is denoted by d in the Figure. The perforation tip can be part of a sequentially working perforation tool, of a perforation die, a perforation reel, etc. If further information regarding different ways to micro-perforate and appropriate tools, reference should be made to the associated literature, especially to published patent applications of this applicant. The perforation tool also comprises a support plate 13, which is soft or flexible enough to allow the perforation tip to penetrate so deep that it protrudes on the bottom side.

The Micro-Perforation (MP) process may, for example, be carried out at room temperature. The MP process may, depending on the type of the polymer layer, also be performed at a different temperature, such as a temperature between room temperature and 300° C. or 400° C. By pressing the tips into the material, the dielectric material is deformed and thrust aside. At the same time, the copper is deformed by the perforation tip. After the perforation process, the copper covers an essential portion of the sidewall of the hole formed by the MP process, as shown in FIG. 1c.

The perforation step may be, depending on the materials involved and the shape of the perforation tip, followed by a plasma or wet chemical cleaning step.

The product after the MP process is shown in FIG. 1c. The walls of the hole fabricated by piercing are at least partially covered by copper material of the top copper layer. Then, at least the first side is plated (FIG. 1d). By this plating process, the remaining gap between the top layer material and the bottom layer material is bridged and a via is formed.

It may be advantageous to plate both sides at once, as shown in the figure. It should be emphasized, though, that only the plating of the side from which the holes have been applied is crucial. It could well be that the thickness of the second copper layer (and possibly even its structure, see below) of the prefabricated product of FIG. 1a, has been chosen so that it does not have to be treated further. By the plating process, the gap between the conductor material of the first layer and the conductor material of the second layer is bridged and a connection is formed.

A following photo-patterning process of both copper layers (FIG. 1e) may, for example, be carried out according to state-of-the-art photo-patterning processes and is not further described hereinafter. The resulting semi-finished product is denoted by 21 in FIG. 1e.

The top and the bottom cap layer are made in a way that is different from the forming of the core. The copper layer 33, which is clad on one side of an uncured dielectric material 31 only, as represented in FIG. 2a, is perforated by the MP process analogously to the core. The copper clad side of the dielectric material in the following is called the top side, the opposing side will be named the back side. For the MP process, again a perforation tool 11 is used (FIG. 2b).

In FIG. 2c, the material after the MP process is shown. Again, the walls or the hole are partially covered by copper.

After the plating step, as shown in FIG. 2d, the walls of the hole are entirely covered with copper so that a via is formed. In addition, some copper material protrudes on the bottom side.

As can be seen in FIG. 2e, these protrusions 35 are subsequently tinned. This tinning can, for example, be done by pressing the cap layer on a soft and possibly warm solder material block or sheet. Some solder material 37 then sticks to the protrusions 35.

The resulting product is denoted by 51 in FIG. 2e. After this procedure, a plasma cleaning step may be carried out on the back side of the product 51 in order to clean away possible pollutants and to remove some dielectric material around the copper protrusions. The product 51 may serve as semi-finished product for manufacturing a several-layer-build-up, such as is described below. As an alternative, the product 51 may also serve as a two-layer PCB/HDI, the protrusions with solder material serving as electrical joints.

Then, in the example described hereinafter with reference to FIGS. 3a–3d, the top and bottom layers 51, 51' (both produced according to FIGS. 2a–2e) are laminated to the core as shown in FIGS. 3a and 3b. In this way, a 4-layer HDI build-up is formed. By doing so, the tinned copper protrusions are pressed towards correspondingly aligned copper pads of the semi-finished product 21. This laminating step may be carried out at room temperature or, depending on the layer materials, at an elevated temperature. In any case, for this laminating step, the parameters such as temperature and pressure are chosen so that the pre-tinned copper tips are soldered to the core. If the polymer material is, for example, a Liquid Crystal Polymer (LCP), the temperature may be between 200° C. and 450° C. FIG. 3a shows the semifinished products 21, 51, 51' and FIG. 3b depicts the lamination/soldering process. The reference numerals 61, 61' denote two plates (which can be replaced by reels) between which the pressure for laminating is developed. Because of the elevated temperature, by which the soldering is made possible, the base material may, depending on its composition, be cured simultaneously with the soldering process. As an alternative to the above described procedure, protrusions without solder material may be welded to the core in a hot or cold welding process. The four-layer build-up 71 after the lamination is shown in FIG. 3c. Finally, the outermost layers of the build-up are photostructured in a conventional way (FIG. 3d).

The above-described embodiments are by no means the only way to carry out the invention. The expert will easily realize that numerous other embodiments can be thought of without leaving the spirit and scope of the invention.

What is claimed is:

1. A method for manufacturing at least one of electrical connecting elements and semifinished products comprising the steps of:

providing a plastically deformable dielectric substrate layer (1, 31) having a first side and a second side, the first side of said plastically deformable dielectric substrate (1, 31) layer being essentially covered by a first conducting layer (3, 33);

piercing the dielectric substrate layer (1, 31), from the first side through the first conducting layer (3, 33) with a perforation tip (11) of a micro-perforation tool, to thereby form pierced holes, said pierced holes having walls that are at least partially covered by conductor material of said first conducting layer (3, 33) and a perforation depth (d) that is greater than a total thickness of the substrate layer (1, 31) and the first conducting layer (3, 33); and, plating the pierced first side with electrically conducting material.

2. The method according to claim 1, comprising the further step of, after piercing the substrate layer and before plating, cleaning the substrate with one of a plasma and wet chemicals.

3. The method according to claim 1, wherein the second side of the plastically deformable dielectric substrate layer (1) is at least partially covered by a second conducting layer (5), wherein the perforation tip (11) during the piercing step also punctures the second conducting layer (5), and wherein the plating step is performed until an electrical connection is formed between the first conducting layer (3) and the second conducting layer (5) across the piercing holes, so that vias are formed.

4. The method according to claim 1, wherein the second side of the substrate layer (31) is free of conducting coverings, wherein the perforation depth exceeds a total thickness of the substrate layer and the first conductor layer, and wherein, after the plating step, conductor material forms protrusions (35) on the second surface at the pierced holes.

5. The method according to claim 3, comprising the further steps of:

providing a second plastically deformable dielectric substrate layer (31) having a first and a second side, the first side of said second plastically deformable dielectric substrate layer (31) being essentially covered by a conducting layer (33), the second side of said second plastically deformable dielectric layer (31) being free of conducting coverings;

piercing holes through the second dielectric substrate layer, from the first side through the first conducting layer with a perforation tip (11) of a micro-perforation tool, to thereby form second pierced holes, said second pierced holes having a perforation depth (d) that is greater than a total thickness of the second substrate layer and the conducting layer covering the second substrate layer;

plating the first side of the second substrate layer, which is essentially covered by the conducting layer, with electrically conducting material so that conductor material forms protrusions (35) from the second pierced holes on the second surface; and joining the first and the second substrate layers such that the second substrate protrusions are joined to electrically conducting material of one of the first and second conducting layers of the first substrate.

6. The method according to claim 5, wherein the protrusions (35) are provided with a cap of soldering material and wherein, during joining of the first and the second substrate layers, the protrusions of the second substrate are soldered to electrically conducting material of said one of the first and second conducting layers of the first substrate.

* * * * *